(12) United States Patent
Karcher et al.

(10) Patent No.: US 6,194,314 B1
(45) Date of Patent: Feb. 27, 2001

(54) PROCESS FOR CHEMICAL VAPOR DEPOSITION LAYER PRODUCTION ON A SEMICONDUCTOR SURFACE WITH ABSORBING PROTECTIVE GASSES

(75) Inventors: Wolfram Karcher, Schwaebisch Gmuend; Lutz Labs, Dresden, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/019,612

(22) Filed: Feb. 6, 1998

(30) Foreign Application Priority Data

Feb. 6, 1997 (DE) .............................. 197 04 533

(51) Int. Cl.⁷ .................................................. C23C 16/08
(52) U.S. Cl. .................... 438/680; 438/685; 427/255.23; 427/253; 427/255.28; 427/299; 427/300
(58) Field of Search ............................. 427/255.1, 255.2, 427/299, 253, 255.23, 255.28, 300; 438/680, 685

(56) References Cited

U.S. PATENT DOCUMENTS

| 5,240,505 | 8/1993 | Iwasaka et al. ........................ 18/719 |
| 5,272,112 | * 12/1993 | Schmitz et al. ....................... 437/192 |
| 5,316,794 | 5/1994 | Carlson et al. ..................... 427/248.1 |
| 5,342,652 | * 8/1994 | Foster et al. ........................ 427/253 |
| 5,435,682 | * 7/1995 | Crabb et al. . |
| 5,599,739 | * 2/1997 | Merchant et al. ................... 437/190 |
| 5,686,355 | * 11/1997 | Sumi et al. ........................... 437/192 |

FOREIGN PATENT DOCUMENTS

| 0416400A1 | 3/1991 | (EP) . |
| 704551 | * 4/1996 | (EP) . |
| 0704551 A1 | 4/1996 | (EP) . |

OTHER PUBLICATIONS

Publication in Electrochem. Soc., vol. 140, No. 2, dated Feb. 1993 (Saito K. et al.), pp. 513–518 "Selective Titanium Silicide Chemical Vapor Decomposition With Surface Cleaning by Silane and Ohmic Contact Formation to Very Shallow Junctions".

Publication in Japanese Journal of Applied Physics dated Jan. 1990, No. 1, Part 2 (Saito K. et al.), pp. 185–187, "Effect of Silicon Surface Cleaning on the Initial Stage of Selective Titanium Silicide Chemical Vapor Deposition".

* cited by examiner

*Primary Examiner*—Timothy Meeks
(74) *Attorney, Agent, or Firm*—Herbert L. Lerner; Laurence A. Greenberg; Werner H. Stemer

(57) ABSTRACT

In chemical gaseous phase deposition (CVD=Chemical Vapor Deposition), there is frequently the problem of there still being an aggressive gas in the reaction chamber from the preceding layer production process. The aggressive gas can be a remainder of a process gas used for layer production or it can be a remainder gas produced by the reaction of the process gasses. The aggressive gas can cause undesirable reactions on the surface of the semiconductor product, which damage the semiconductor product. A process for layer production on a surface includes supplying at least one protective gas to the surface before and/or during the heating of the surface to the reaction temperature. Through the use of the protective gas, on one hand the aggressive gas still remaining in the reaction chamber is thinned and on the other hand a part of the protective gas adsorbs onto the cold surface so that on the surface, preferably reactions of the aggressive gas with the protective gas occur and the surface layers themselves remain essentially undamaged.

7 Claims, 2 Drawing Sheets

PROCESS FOR CHEMICAL VAPOR DEPOSITION LAYER PRODUCTION ON A SEMICONDUCTOR SURFACE WITH ABSORBING PROTECTIVE GASSES

BACKGROUND OF THE INVENTION

Field of the Invention

The invention relates to a process for layer production on a surface, in particular a process for layer production on a surface of a semiconductor product.

The manufacture of semiconductor products, in particular of integrated semiconductor products, requires a complex sequence of individual steps. The manufacturing steps in which layers of material are produced on the surface of a semiconductor product assume an important role.

There are a number of processes available for the production of material layers, wherein processes in which the layers to be produced are deposited from the gaseous phase are the ones used most frequently. In particular chemical gaseous phase deposition (CVD=Chemical Vapor Deposition) is one of the most important processes for layer production. The basic principle of CVD is to conduct selected process gasses over a heated surface of a semiconductor product upon which the desired layer is intended to be deposited. A reaction of the process gasses occurs on the hot surface so that on one hand, the desired layer and on the other hand, remainder gasses that must be removed, are produced as reaction products.

The chemical gaseous phase deposition is usually carried out at low pressure in reaction chambers. The semiconductor products to be processed are fed into the reaction chamber and are heated to a predetermined temperature in the reaction chamber. Through the use of one or several gas inlets, the process gasses are supplied to the surface of the semiconductor product and the remainder gasses produced through the reaction of the process gasses are pumped out of the reaction chamber.

If a new semiconductor product is then fed into the reaction chamber for layer production, there is frequently the problem of there still being an aggressive gas in the reaction chamber from the preceding layer production process. That aggressive gas can be a remainder of a process gas used for layer production or it can be a remainder gas produced by the reaction of the process gasses. The aggressive gas can cause undesirable reactions on the surface of the semiconductor product, which damage the semiconductor product.

For example, in the production of tungsten layers, $WF_6$ is used as one of the process gasses. However, if $WF_6$ comes into contact with the surface of a Ti/TiN layer, which is used as a contact and barrier layer between silicon and tungsten, then undesirable reactions of $WF_6$ and titanium can occur:

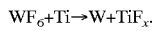

$WF_6 + Ti \rightarrow W + TiF_x$.

Those kinds of reactions of $WF_6$ and titanium break down the Ti/TiN layer or impair the electrical properties (e.g. contact resistances) and can consequently jeopardize the functionality of the semiconductor product. Additionally, if $WF_6$ comes into contact with a silicon surface, an undesirable reaction can occur, which damages the silicon surface:

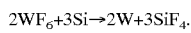

$2WF_6 + 3Si \rightarrow 2W + 3SiF_4$.

SUMMARY OF THE INVENTION

It is accordingly an object of the invention to provide a process for layer production on a surface, which overcomes the hereinafore-mentioned disadvantages of the heretofore-known processes of this general type and in which damage to the surface by aggressive gasses is prevented.

With the foregoing and other objects in view there is provided, in accordance with the invention, a process for layer production on a surface, which comprises heating a surface to a predetermined temperature; supplying at least one first gas and at least one second gas reacting with the first gas, to the heated surface for layer deposition; and supplying at least one protective gas to the surface before and/or during the heating of the surface.

Through the use of the protective gas, on one hand, the aggressive gas still remaining in the reaction chamber is thinned and on the other hand, a part of the protective gas adsorbs onto the cold surface so that on the surface, preferably reactions of the aggressive gas with the protective gas occur and the surface layers themselves remain essentially undamaged. The protective gas is selected in such a way that in comparison to the atoms or molecules on the surface to be coated, it has a higher reactivity to the aggressive gas.

The invention can also be thought of as a process for protecting a surface during a process for layer production. The process for protecting a surface comprises supplying a protective gas to the surface before and/or during the heating of the surface.

In accordance with another mode of the invention, the protective gas is supplied to the surface together with a carrier gas, in particular argon.

It is furthermore preferable if the process for layer production is used to deposit a metallic layer, in particular a tungsten layer or a molybdenum layer.

In accordance with a further mode of the invention, at least one gas from the group of metal halogenides is selected as the first gas.

In accordance with an added mode of the invention, at least one gas from the group of silanes or hydrogen ($H_2$) is selected as the second gas.

In accordance with an additional mode of the invention, a gas from the group of silanes, in particular silane ($SiH_4$) is used as the protective gas.

In accordance with a concomitant mode of the invention, the process for layer production is carried out in a reaction chamber, and the protective gas is supplied to the surface at a location at which the product to be coated is fed into the reaction chamber. As a result, concentration of the aggressive gas can be reduced at this point without the throughput for the entire process being reduced.

Other features which are considered as characteristic for the invention are set forth in the appended claims.

Although the invention is illustrated and described herein as embodied in a process for layer production on a surface, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
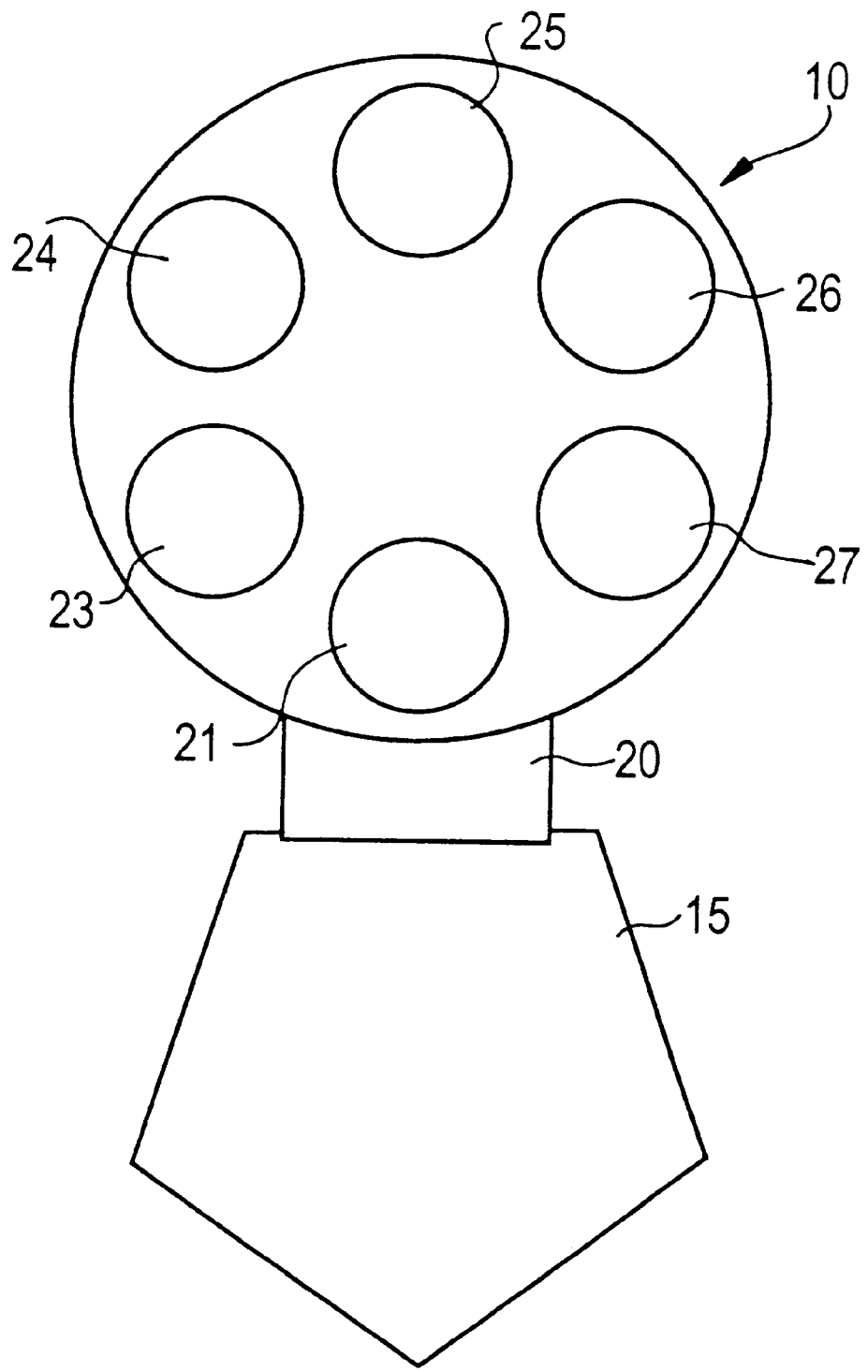
FIG. 1 is a diagrammatic, front-elevational view of a CVD reaction chamber which is used for a process according to the invention.
Figure 2:
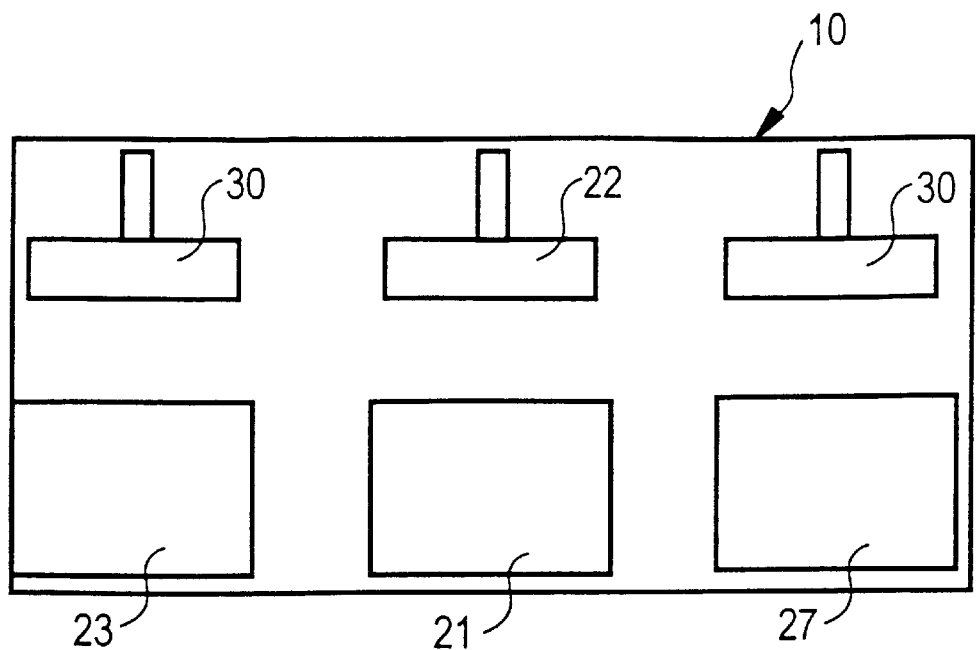
FIG. 2 is a side-elevational view of the CVD reaction chamber shown in FIG. 1.

Referring now to the figures of the drawings in detail and first, particularly, to FIG. 1 thereof, there is seen a diagrammatic representation of a CVD reaction chamber 10 which is used for a process according to the invention. A semiconductor product to be treated, usually a wafer, is introduced from a transfer region 15 upstream of the reaction chamber 10, through a transfer canal 20, into the reaction chamber 10. There, the semiconductor product is dropped off at a station 21. A gas inlet 22 seen in FIG. 2 is disposed above the station 21. A protective gas and a carrier gas are supplied to a still-cold surface (approximately room temperature) of the semiconductor product through the use of the gas inlet 22. The semiconductor product is moved from the first station 21 downstream of the transfer canal 20 to a station 23, through the use of a non-illustrated transport mechanism. In the further course of the layer production, the semiconductor product is transported from this station 23 in a clockwise direction to remaining stations 24 to 27 in the reaction chamber. The semiconductor product is thereby heated to a predetermined temperature. Gas inlets are also disposed above the individual stations 23 to 27. Process gasses for layer production are supplied to the surface of the semiconductor product through the use of the gas inlets. If the semiconductor product is disposed at the station 27 and the process of layer deposition is finished, the semiconductor product is transported from the station 27 to the station 21 and removed from the reaction chamber through the use of the transfer canal 20. At the same time, other semiconductor products which are disposed at stations 23 to 26 are each moved one station further in a clockwise direction. After this, a new semiconductor product is once again conducted into the reaction chamber 10 through the transfer canal 20 and through the station 21 to the station 23.

For example, a tungsten layer can be deposited on a Ti/TiN layer through the use of a reaction chamber 10 of this kind. A semiconductor product disposed at the station 23 is heated to a temperature of approximately 440° C. Process gasses $WF_6$ and $SiH_4$, which are necessary for depositing a tungsten seed layer, are supplied to the surface of the semiconductor product through the use of gas inlets 30 seen in FIG. 2, which are disposed above station 23. The process gasses react according to a reaction equation:

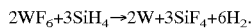
$2WF_6 + 3SiH_4 \rightarrow 2W + 3SiF_4 + 6H_2$.

If a sufficient seed layer is developed on the surface of the semiconductor product, the semiconductor product is transported to the next station 24. Gas inlets are also disposed above the station 24. Process gasses $WF_6$ and $H_2$, which are necessary for depositing a tungsten bulk layer, are supplied to the surface of the semiconductor product through the use of those gas inlets. The process gasses react according to a reaction equation:

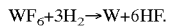
$WF_6 + 3H_2 \rightarrow W + 6HF$.

This depositing of a tungsten bulk layer is repeated at the stations 25 to 27 so that a sufficiently thick tungsten layer can be produced.

Due to the chosen disposition of stations in the reaction chamber, it is naturally possible for the aggressive gases $WF_6$ and HF at the station 21 to reach the cold semiconductor product, which has just newly been fed into the reaction chamber. These aggressive gasses could react with the surface layers of the cold semiconductor product and consequently damage the surface. In order to prevent this to as large an extent as possible, the gas inlet 22 is disposed above the station 21. A mixture of argon (Ar) and silane ($SiH_4$) is supplied to the surface of the cold semiconductor product through the use of the gas inlet 22. Through the use of these gasses, on one hand the aggressive gasses $WF_6$ and HF that are present in the reaction chamber are thinned at the position of the station 21, and on the other hand a part of the silane adsorbs onto the cold surface so that preferably reactions of the aggressive gasses with the silane ($SiH_4$) occur on the surface and the surface layers themselves remain essentially undamaged. The thin tungsten layer or tungsten silicide layer that is a few nanometers thick and is produced in the reaction of $WF_6$ and silane ($SiH_4$) does not need to be removed. This thin intermediary layer does not hinder the further deposition of the tungsten layer.

The other chemical reactions in the reaction chamber are not influenced by the introduction of the additional silane above the station 21, so that the protective gas does not have a noticeable negative impact on the throughput of the semiconductor products through the reaction chamber 10.

Figure 3:
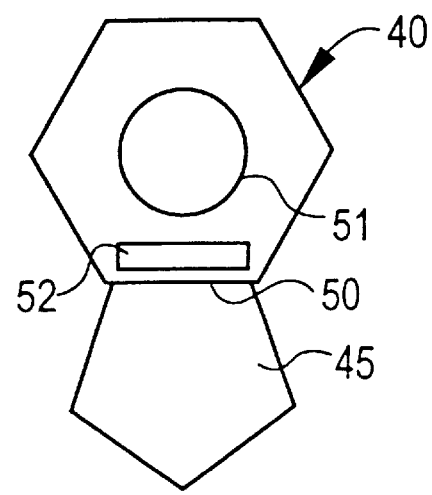
FIG. 3 is a front-elevational view of another reaction chamber for carrying out a process according to the invention.

FIG. 3 is a diagrammatic representation of another reaction chamber for carrying out the process according to the invention. In this case, the semiconductor product to be treated, usually a wafer, is introduced into a reaction chamber 40 from a transfer region 45 upstream of the reaction chamber 40, through a transfer canal 50. On the way from the transfer canal 50 to a station 51, the semiconductor product is guided through under a gas inlet 52, through the use of which a protective gas is supplied to the surface of the semiconductor product. The semiconductor product is heated to a predetermined temperature at the station 51. Another non-illustrated gas inlet is disposed above the station 51. Gasses are supplied to the surface of the semiconductor product through the use of that gas inlet. In contrast to the reaction chamber 10 of FIG. 1, the reaction chamber 40 is constructed in such a way that only one semiconductor product can ever be treated in the reaction chamber 40. In this case, through the use of the protective gas, on one hand the aggressive gasses present in the reaction chamber, for example $WF_6$ and HF, are thinned at the position downstream of the transfer canal 50, and on the other hand a part of the protective gas adsorbs onto the cold surface so that preferably reactions of the aggressive gas with the protective gas occur on the surface and the surface layers themselves remain essentially undamaged. In the reaction chamber 40 as well, the throughput of semiconductor products through the reaction chamber 40 is not influenced in a negative way by the additionally provided gas inlet for the protective gas.

Alternatively, though, the semiconductor product can also be acted on by a protective gas at the station 51 in the cold state or during the heating.

We claim:

1. A process for layer production on a surface, which comprises:

introducing a semiconductor product from a transfer region through a transfer canal into a station of a reaction chamber;

heating a surface of the semiconductor product to a predetermined temperature;

supplying at least one first gas and at least one second gas reacting with the first gas to the heated surface for layer deposition; and supplying at least one protective gas to the surface of the semiconductor product when the semiconductor product is on the way from the transfer region to the station prior to heating, wherein the at least one protective gas is absorbable onto the surface when the surface is cold.

2. The process according to claim 1, which comprises supplying the protective gas and a carrier gas to the surface.

3. The process according to claim 1, which comprises supplying the protective gas and an argon carrier gas to the surface.

4. The process according to claim 1, wherein the first gas is at least one metal halogenide.

5. The process according to claim 1, wherein the second gas is at least one gas from the group consisting of silanes and $H_2$.

6. The process according to claim 1, wherein the at least one protective gas is a silane.

7. The process according to claim 1, wherein the at least one protective gas is $SiH_4$.

* * * * *